United States Patent
Goh et al.

(10) Patent No.: US 7,078,333 B2
(45) Date of Patent: Jul. 18, 2006

(54) METHOD TO IMPROVE ADHESION OF DIELECTRIC FILMS IN DAMASCENE INTERCONNECTS

(76) Inventors: Luona Goh, BIK 108, Bedok North Rd #09-2224, Singapore 460108 (SG); Simon Chooi, 60 Woodlands Industrial Park D Street 2, Singapore 738406 (SG); Siew Lok Toh, Dept of Mechanical Engrg, NUS, 10 Kent Ridge Cresent, Singapore 119260 (SG); Tong Earn Tay, Dept of Mech. Engrg., N.U.S., 10 Kent Ridge Cres., Singapore 119260 (SG)

( * ) Notice: Subject to any disclaimer, the term of this patent is extended or adjusted under 35 U.S.C. 154(b) by 0 days.

(21) Appl. No.: 10/943,101

(22) Filed: Sep. 16, 2004

(65) Prior Publication Data

US 2005/0032392 A1    Feb. 10, 2005

Related U.S. Application Data

(62) Division of application No. 09/912,737, filed on Jul. 26, 2001, now Pat. No. 6,797,605.

(51) Int. Cl.
*H01L 21/4763* (2006.01)
(52) U.S. Cl. ............... 438/622; 438/623; 438/637; 438/665
(58) Field of Classification Search ........ 438/622–629, 438/637, 639, 653–654, 656, 648, 687, 675, 438/778, 780, 787, 791, 665
See application file for complete search history.

(56) References Cited

U.S. PATENT DOCUMENTS

| 4,849,248 A | 7/1989 | Hashimoto | 427/38 |
|---|---|---|---|
| 5,192,697 A | 3/1993 | Leong | 437/37 |
| 5,459,086 A | 10/1995 | Yang | 437/35 |
| 5,985,750 A | 11/1999 | Oda | 438/623 |
| 6,117,798 A | 9/2000 | Fang et al. | 438/782 |
| 6,143,670 A | 11/2000 | Cheng et al. | 438/780 |
| 6,153,523 A | 11/2000 | Van Ngo et al. | 438/687 |
| 6,184,123 B1 | 2/2001 | Ge et al. | 438/624 |
| 6,294,315 B1 * | 9/2001 | Shin et al. | 438/706 |
| 6,358,842 B1 * | 3/2002 | Zhou et al. | 438/633 |
| 6,624,053 B1 * | 9/2003 | Passemard | 438/584 |

* cited by examiner

*Primary Examiner*—Kevin M. Picardat

(57) ABSTRACT

Method of improving adhesion of low dielectric constant films to other dielectric films and barrier metals in a damascene process are achieved. In one method, a low dielectric constant material layer is deposited on a substrate. Silicon ions are implanted into the low dielectric constant material layer. Thereafter, a TEOS-based silicon oxide layer is deposited overlying the low dielectric constant material whereby there is good adhesion between low dielectric constant material layer and the TEOS-based silicon oxide layer. In another method, a low dielectric constant material layer is deposited on a substrate. A silicon-based dielectric layer is deposited overlying the low dielectric constant material wherein the silicon-based dielectric layer is not silicon oxide whereby there is good adhesion between the low dielectric constant material layer and the silicon-based dielectric layer.

11 Claims, 5 Drawing Sheets

METHOD TO IMPROVE ADHESION OF
DIELECTRIC FILMS IN DAMASCENE
INTERCONNECTS

This is a division of patent application Ser. No. 09/912,737, filing date Jul. 26, 2001, now U.S. Pat. No. 6,797,605. A Method To Improve Adhesion Of Dielectric Films In Damascene Interconnects, assigned to the same assignee as the present invention, which is herein incorporated by reference in its entirety.

BACKGROUND OF THE INVENTION (1) Field of the Invention

The invention relates to a method of metallization in the fabrication of integrated circuits, and more particularly, to a method of improving adhesion of low dielectric constant materials to other materials during metallization in the manufacture of integrated circuits.

(2) Description of the Prior Art

The damascene or dual damascene process has become a future trend in integrated circuit manufacturing, especially in the copper metallization process. In a typical copper damascene scheme, dielectric layers are formed over a passivation layer on a substrate. An etch stop layer may be formed between two dielectric layers and a cap layer may be formed over the topmost dielectric layer. A via and trench are patterned into the dielectric layers to the passivation layer. Then a barrier metal layer is deposited within the trench and via, followed by deposition of a copper layer to fill the damascene opening.

Low dielectric constant materials are preferably used to reduce capacitance. An integration challenge facing damascene interconnects incorporating low dielectric constant materials and copper is the adhesion of these low dielectric constant materials to other damascene films. Poor adhesion is a cause for reliability concerns. In recent experiments, the inventors have determined that tetraethoxysilane (TEOS)-based silicon oxide did not adhere well on carbon-doped silicon oxide materials such as alkyl silsesquioxanes and perhydrosilazanes. It is desired to find a method to improve adhesion of low dielectric constant materials with other dielectric materials.

U.S. Pat. No. 6,184,123 to Ge et al discloses a silicon ion implantation into spin-on-glass to improve adhesion to an overlying silicon nitride layer. U.S. Pat. No. 6,143,670 to Cheng et al shows a nitrogen ion implantation into a polymer layer to improve adhesion to an overlying layer containing silicon, oxygen, and nitrogen. U.S. Pat. No. 5,985,750 to Oda implants silicon ions into a BPSG layer to form a damage layer before depositing a fluorine amorphous carbon layer. U.S. Pat. Nos. 6,117,798 to Fang et al and U.S. Pat. No. 5,459,086 to Yang teach an ion implantation into spin-on-glass to prevent moisture absorption. U.S. Pat. No. 5,192,697 to Leong teaches curing of spin-on-glass using ion implantation. U.S. Pat. No. 4,849,248 to Hashimoto discloses silicon ion implantation into silicon dioxide to control grain size. U.S. Pat. No. 6,153,523 to Van Ngo et al shows the use of an ammonia-containing plasma to roughen a copper surface to improve adhesion of an overlying silicon nitride capping layer.

SUMMARY OF THE INVENTION

A principal object of the present invention is to provide an effective and very manufacturable method of improving adhesion of dielectric films in the fabrication of integrated circuit devices.

Another object of the invention is to provide a method of improving adhesion of dielectric films in a damascene metallization process.

Yet another object of the invention is to a method of improving adhesion of low dielectric constant films to other dielectric films in a damascene process.

In accordance with the objects of this invention a method of improving adhesion of low dielectric constant films to other dielectric films in a damascene process is achieved. A low dielectric constant material layer is deposited on a substrate. Silicon ions are implanted into the low dielectric constant material layer. Thereafter, a TEOS-based silicon oxide layer is deposited overlying the low dielectric constant material whereby there is good adhesion between low dielectric constant material layer and the TEOS-based silicon oxide layer.

Also, in accordance with the objects of the invention, another method of improving adhesion of low dielectric constant films to other dielectric films in a damascene process is achieved. A low dielectric constant material layer is deposited on a substrate. A silicon-based dielectric layer is deposited overlying the low dielectric constant material wherein the silicon-based dielectric layer is not silicon oxide whereby there is good adhesion between the low dielectric constant material layer and the silicon-based dielectric layer.

BRIEF DESCRIPTION OF THE DRAWINGS

In the accompanying drawings forming a material part of this description, there is shown.

DESCRIPTION OF THE PREFERRED EMBODIMENTS

Figure 1:
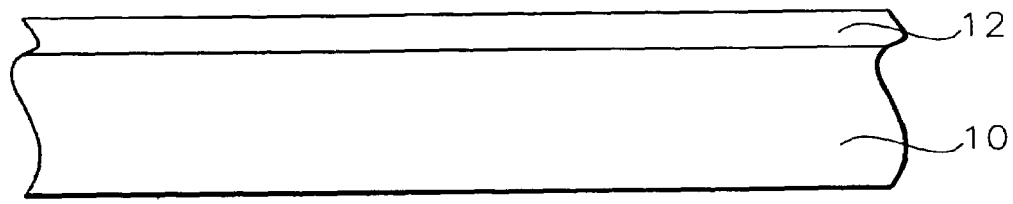
FIGS. 1 through 9 schematically illustrate in cross-sectional representation a first preferred embodiment of the present invention.

The present invention proposes two alternative methods of improving adhesion of low dielectric constant films to other dielectric films and barrier metals in a damascene process. It will be understood by those skilled in the art that the present invention should not be limited to the dual damascene application illustrated in the drawings, but can be extended and applied to any application in which improved adhesion of dielectric films is desired.

The first embodiment of the present invention comprises a pre-treatment of a low dielectric constant film before depositing a silicon oxide film. The first embodiment will be described with reference to FIGS. 1 through 9. The second embodiment of the invention comprises using a silicon-based dielectric film other than silicon oxide over a low dielectric constant film. The second embodiment will be described with reference to FIGS. 10 through 13.

The first embodiment of the present invention now will be described with reference to FIGS. 1 through 9. Referring now more particularly to FIG. 1, there is illustrated a portion of a partially completed integrated circuit device. There is shown a substrate 10, preferably composed of monocrystalline silicon. Device structures, such as gate electrodes, source and drain regions, and metal interconnects, not shown, are formed in and on the substrate and covered with an insulating layer. A passivation or barrier layer 12 may be formed over the device structures to a thickness of between about 50 and 5000 Angstroms. The passivation layer may comprise silicon nitride, silicon carbide, silicon oxynitride, silicon dioxide, boron nitride, or BLOK (from Applied Materials), for example.

Figure 2:
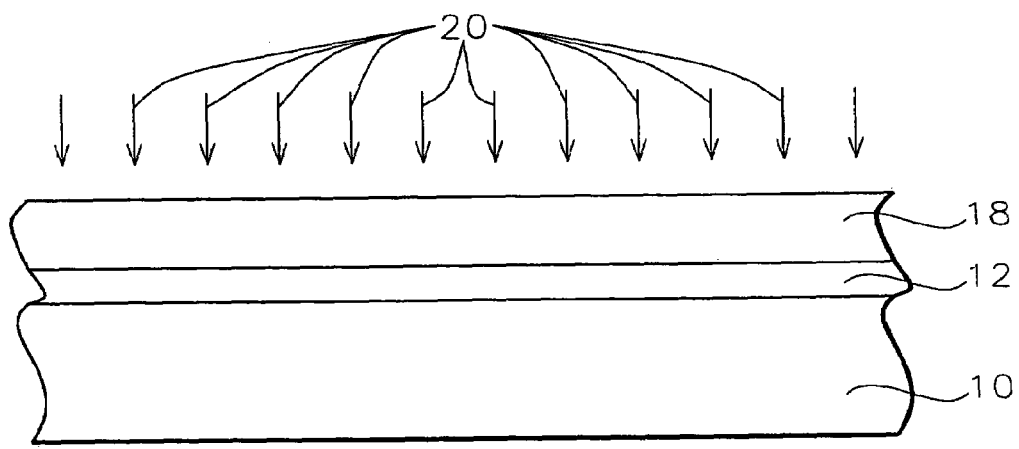

Referring to FIG. 2, a first low dielectric constant (k) material layer 18 is deposited over the passivation layer 12 to a thickness of between about 500 and 50,000 Angstroms. The first low dielectric constant material may be a porous or non-porous carbon-doped silicon oxide (such as alkyl silsesquioxanes), a porous or non-porous doped silicon oxide film (such as fluorosilicate glass (FSG) and phosphosilicate glass (PSG)), porous or non-porous organic polymers, or porous or non-porous inorganic polymers.

Now, an etch stop layer or cap layer is to be deposited over the low-k material layer 18. For example, in a dual-damascene process, there is often an etch stop layer interposed between two low-k material layers. In a single damascene process, or in some cases in a dual damascene process, there may be no etch stop layer, but a capping layer over the topmost low-k material layer. Preferably in this embodiment, the etch stop or capping layer will be a TEOS-based silicon oxide layer. It has been found that for a TEOS-based silicon oxide layer having a thickness greater than 2000 Angstroms, poor adhesion to the underlying low-k material layer is experienced.

The inventors have experimented with various pre-treatments of the low-k material layer before deposition of the etch stop or capping layer. These pre-treatments included nitrogen plasma, argon implantation, silicon implantation, and phosphorus implantation. Only the silicon implantation resulted in non-peeling of the overlying TEOS-based oxide from the low-k material layer. A dramatic improvement in adhesion strength was observed. Further, the shallow implantation of the invention does not change the dielectric constant of the dielectric film, thus maintaining its integrity.

Figure 3:
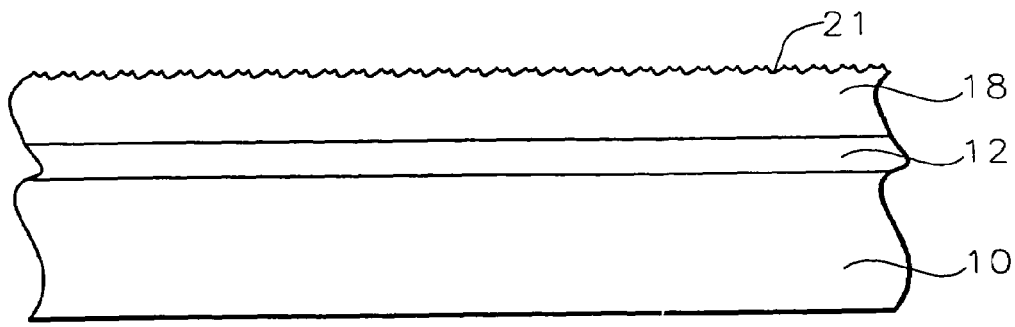

FIG. 2 illustrates the silicon implantation pre-treatment of the present invention. Silicon ions are implanted into the low-k material layer at an energy of between about 5 and 30 KeV with a dosage of between about 1 E 12 and 1 E 16 ions/cm$^2$. The targeted mean depth of implantation is between about 50 and 600 Angstroms. FIG. 3 illustrates the roughened silicon-implanted surface 21 of the low-k material layer 18.

Figure 4:
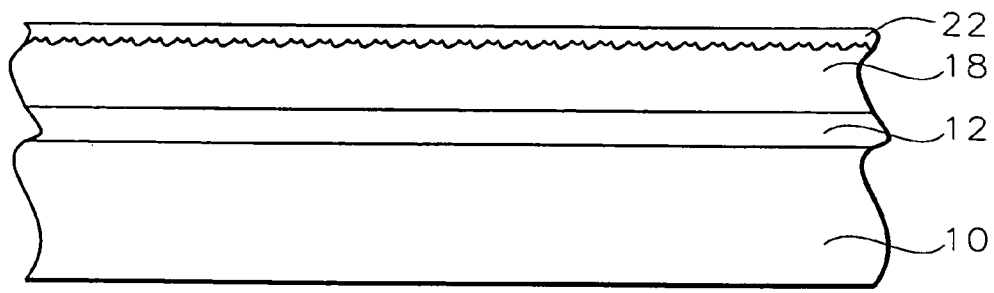

Referring now to FIG. 4, after pre-treatment of the low-k material layer 18, the etch stop or capping layer 22 is deposited to a thickness of between about 50 and 5000 Angstroms. The etch stop or capping layer 22 comprises TEOS-based silicon oxide.

Figure 5:
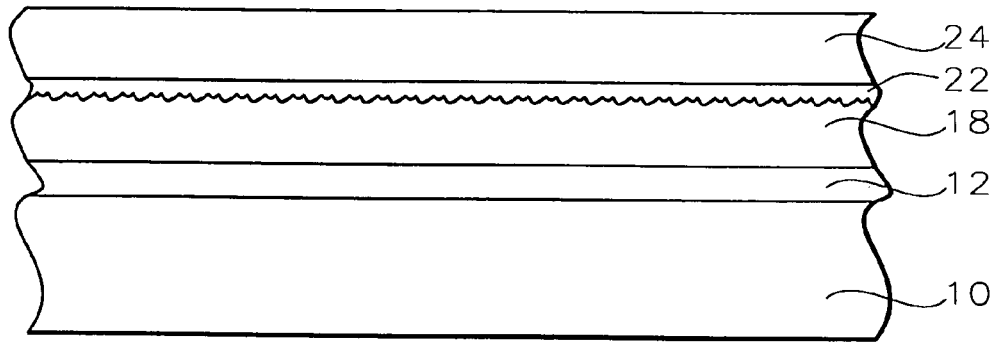
Figure 6:
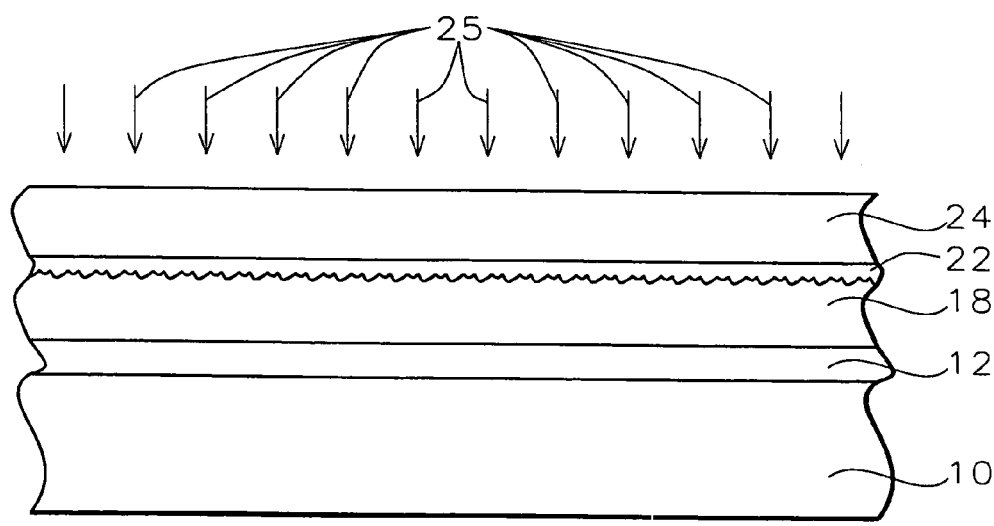

If layer 22 is an etch stop layer, a second low-k material layer 24 is deposited over the etch stop layer 22, as shown in FIG. 5. Silicon ion implantation 25 is again performed as a pre-treatment of the second low-k material layer 24, as shown in FIG. 6.

Figure 7:
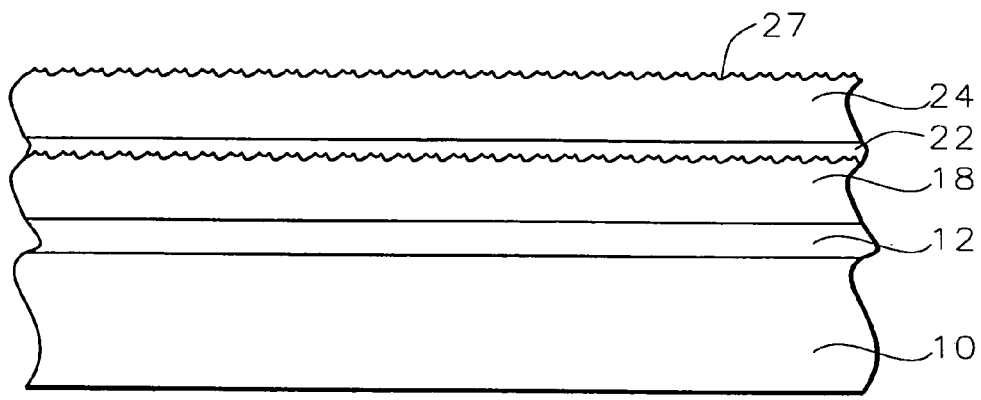
Figure 8:
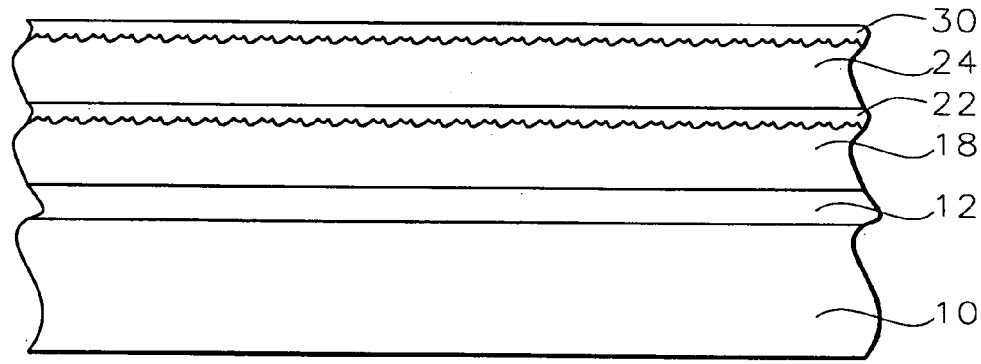

The roughened surface 27 of the low-k material layer 24 is shown in FIG. 7. Now, a capping layer 30 is deposited over the treated low-k material layer 24 to a thickness of between about 50 and 5000 Angstroms, as illustrated in FIG. 8. The second ion implantation is necessary only if the optional capping layer 30 is to be deposited.

Figure 9:
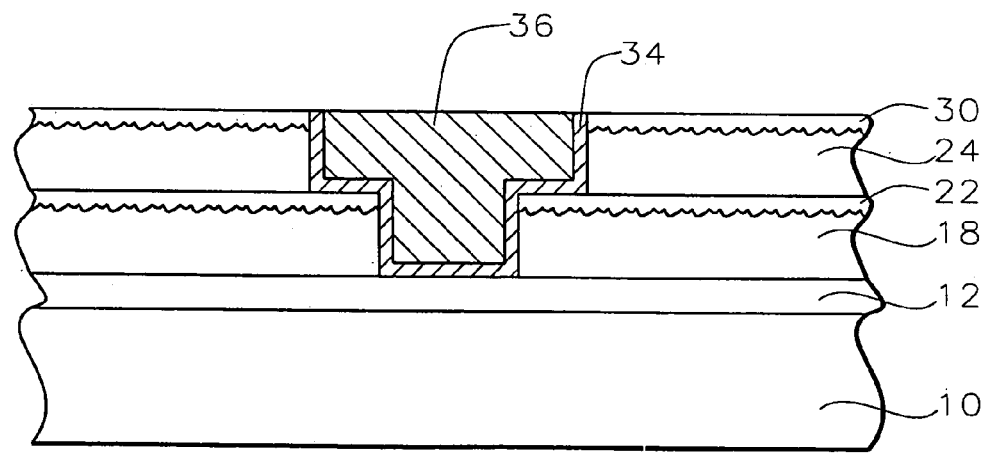

Now, as shown in FIG. 9, a dual damascene opening is etched through the first and second dielectric layers, the capping layer and the etch stop layer, using one of the various schemes such as trench-first, via-first, or embedded via. The dual damascene opening is then filled with a barrier metal layer 34 and a copper layer 36 by any of the conventional means, including physical or chemical vapor deposition and etchback or polishing or electroless plating, and so on.

The pre-treatment process of the present invention can be used in the presence of an etch stop layer, in the presence of a capping layer, or in the presence of both an etch stop layer and a capping layer. For example, in a single damascene process with no etch stop layer, the pre-treatment of the present invention can be used if a capping layer is present.

Figure 10:
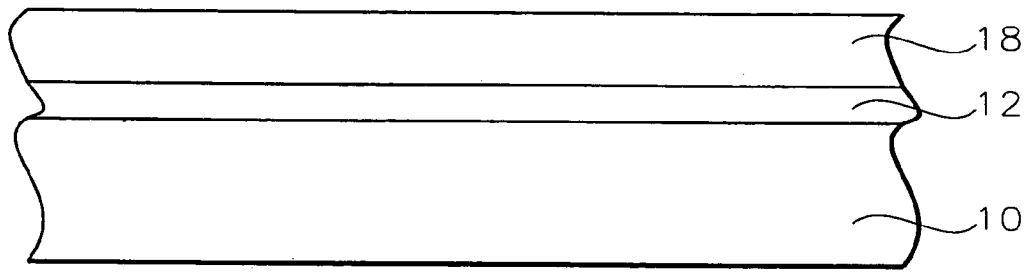
FIGS. 10 through 13 schematically illustrate in cross-sectional representation a second preferred embodiment of the present invention.
Figure 11:
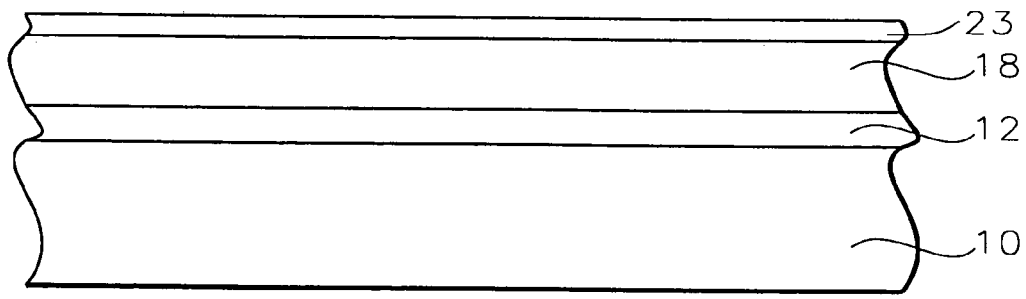

The second embodiment of the present invention will be described with reference to FIGS. 10 through 13. Referring now more particularly to FIG. 10, there is illustrated a portion of a partially completed integrated circuit device. There is shown a substrate 10, preferably composed of monocrystalline silicon. Device structures, such as gate electrodes, source and drain regions, and metal interconnects, not shown, are formed in and on the substrate and covered with an insulating layer.

A passivation or barrier layer 12 may be formed over the device structures to a thickness of between about 50 and 5000 Angstroms. The passivation layer may comprise silicon nitride, silicon carbide, silicon oxynitride, silicon dioxide, boron nitride, or BLOK (from Applied Materials), for example. A first low dielectric constant (k) material layer 18 is deposited over the passivation layer 12 to a thickness of between about 5000 and 50,000 Angstroms. The first low dielectric constant material may be a porous or non-porous carbon-doped silicon oxide (such as alkyl silsesquioxanes), a porous or non-porous doped silicon oxide film (such as fluorosilicate glass (FSG) or phosphosilicate glass (PSG)), porous or non-porous organic polymers, or porous or non-porous inorganic polymers.

Now, an etch stop layer or cap layer is to be deposited over the low-k material layer 18. For example, in a dual-damascene process, there is often an etch stop layer interposed between two low-k material layers. In a single damascene process, or in some cases in a dual damascene process, there may be no etch stop layer, but a capping layer over the topmost low-k material layer.

It has been found by the inventors that an improvement in adhesion can be obtained without the pre-treatment of the first embodiment if the etch stop or capping layer comprises a silicon-based dielectric film that is not silicon oxide. That is, silicon nitride, silicon carbide, silicon oxynitride, silsesquioxanes, or other silicon-based material that is not silicon oxide can be used. If silicon oxynitride is used, silicon-rich silicon oxynitride is preferred. The silicon-based film 23, illustrated in FIG. 11, can be deposited by chemical vapor deposition or spin-coating followed by baking and/or curing. The etch stop or capping layer 23 is deposited to a thickness of between about 50 and 5000 Angstroms.

Figure 12:
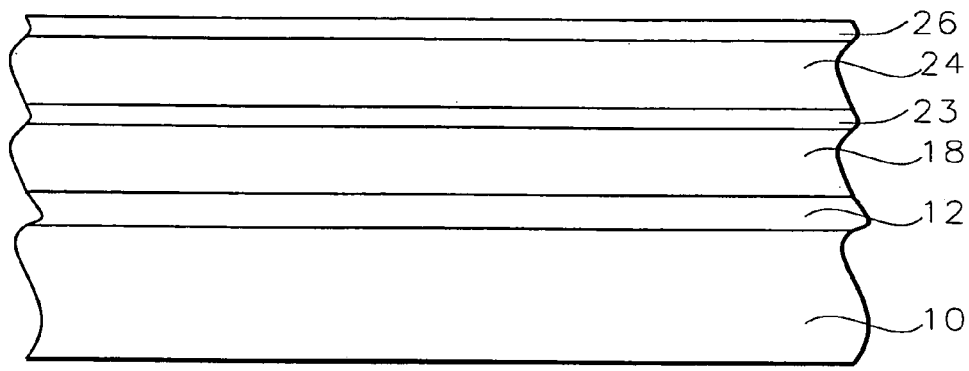

If layer 23 is an etch stop layer, a second low-k material layer 24 is deposited over the etch stop layer 23, as shown in FIG. 12. Now, a capping layer 26 is deposited over the low-k material layer 24 to a thickness of between about 50 and 5000 Angstroms. Again, silicon nitride, silicon carbide, silsesquioxanes, silicon oxynitride, or other silicon-based material that is not silicon oxide can be used as the capping layer. If silicon oxynitride is used, silicon-rich silicon oxynitride is preferred.

Figure 13:
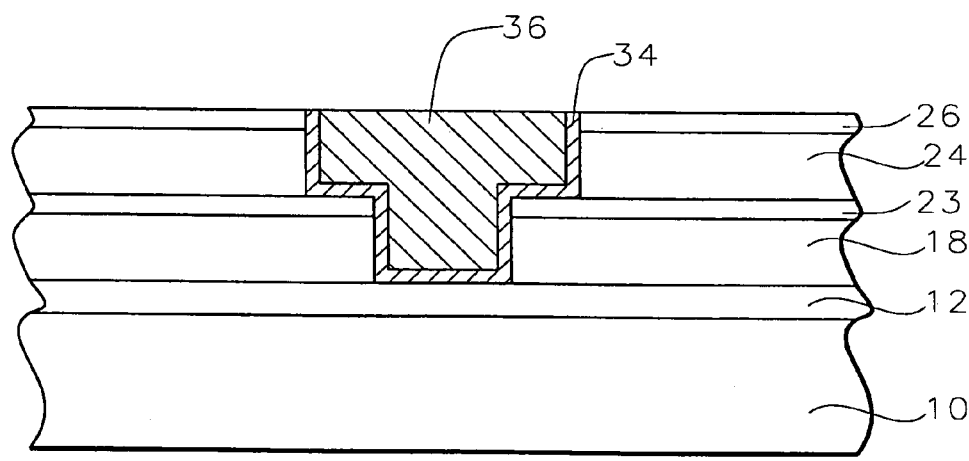

Now, as shown in FIG. 13, a dual damascene opening is etched through the first and second dielectric layers, the capping layer and the etch stop layer, using one of the various schemes such as trench-first, via-first, or embedded via. The dual damascene opening, is then filled with a barrier metal layer 34 and a copper layer 36 by any of the conventional means, including physical or chemical vapor deposition and etchback or polishing or electroless plating, and so on.

The process of the present invention, using a silicon-based dielectric film, with the exception of silicon oxide, over the low-k material film provides improved adhesion of the etch stop and/or capping layer.

The process of the present invention, using pre-treatment of a low-k dielectric material film before depositing a TEOS layer thereover or using a silicon-based dielectric film, with the exception of silicon oxide, over the low-k material film provides dramatic adhesion improvement over the prior art. The adhesion improvement has been shown with a peel test and with a modified tape test (described in co-pending U.S. patent application Ser. No. 09/771,512 filed on Jan. 25, 2001).

While the invention has been particularly shown and described with reference to the preferred embodiments thereof, it will be understood by those skilled in the art that various changes in form and details may be made without departing from the spirit and scope of the invention.

What is claimed is:

1. A method of forming a dielectric material layer comprising:
    depositing a low dielectric constant material layer on a substrate, wherein said low dielectric constant material layer is selected from the group consisting of: porous and non-porous carbon-doped silicon oxides, porous doped silicon oxides, porous and non-porous organic polymers, and porous and non-porous inorganic polymers; and
    depositing a silicon-based dielectric layer which is not silicon oxide overlying said low dielectric constant material whereby there is good adhesion between said low dielectric constant material layer and said silicon-based dielectric layer.

2. The method according to claim 1 wherein said low dielectric constant material layer has a thickness of between about 500 and 50,000 Angstroms.

3. The method according to claim 1 wherein said silicon-based dielectric layer is selected from the group consisting of: silicon nitride, silicon carbide, silicon oxynitride, silsesquioxanes, and silicon-rich silicon oxynitride.

4. The method according to claim 1 wherein said silicon-based dielectric layer has a thickness of between about 50 and 5000 Angstroms.

5. A method of dual damascene copper metallization in the fabrication of an integrated circuit device comprising:
    depositing a first low dielectric constant material layer over a substrate, wherein said first low dielectric constant material layer is selected from the group consisting of: porous and non-porous carbon-doped silicon oxides, porous doped silicon oxides, porous and non-porous organic polymers, and porous and non-porous inorganic polymers;
    depositing a silicon-based dielectric etch stop layer which is not silicon oxide overlying said first low dielectric constant material whereby there is good adhesion between said first low dielectric constant material layer and said silicon-based dielectric etch stop layer;
    depositing a second low dielectric constant material layer overlying said etch stop layer, wherein said second low dielectric constant material layer is selected from the group consisting of: porous and non-porous carbon-doped silicon oxides, porous doped silicon oxides, porous and non-porous organic polymers, and porous and non-porous inorganic polymers;
    depositing a silicon-based dielectric capping layer which is not silicon oxide overlying said second low dielectric constant material whereby there is good adhesion between said second low dielectric constant material layer and said silicon-based dielectric capping layer;
    forming a dual damascene opening through said capping layer, said second low dielectric constant material layer, said etch stop layer, and said first low dielectric constant material layer; and
    forming a barrier metal layer and a copper layer within said dual damascene opening to complete said copper metallization in the fabrication of said integrated circuit device.

6. The method according to claim 5 wherein said first and second low dielectric constant material layers have a thickness of between about 500 and 50,000 Angstroms.

7. The method according to claim 5 wherein said silicon-based dielectric layer is selected from the group consisting of: silicon nitride, silicon carbide, silicon oxynitride, silsesquioxanes, and silicon-rich silicon oxynitride.

8. The method according to claim 5 wherein said silicon-based dielectric layers have a thickness of between about 50 and 5000 Angstroms.

9. A method of forming a dielectric material layer comprising:
    depositing a low dielectric constant material layer on a substrate wherein said low dielectric constant material is selected from the group consisting of: porous and non-porous carbon-doped silicon oxides, porous doped silicon oxides, porous and non-porous organic polymers, and porous and non-porous inorganic polymers; and
    depositing a silicon-based dielectric layer overlying said low dielectric constant material wherein said silicon-based dielectric layer is selected from the group consisting of: silicon nitride, silicon oxynitride, silsesquioxanes, and silicon-rich silicon oxynitride whereby there is good adhesion between said low dielectric constant material layer and said silicon-based dielectric layer.

10. The method according to claim 9 wherein said low dielectric constant material layer has a thickness of between about 500 and 50,000 Angstroms.

11. The method according to claim 9 wherein said silicon-based dielectric layer has a thickness of between about 50 and 5000 Angstroms.

* * * * *

UNITED STATES PATENT AND TRADEMARK OFFICE
CERTIFICATE OF CORRECTION

PATENT NO.         : 7,078,333 B2  Page 1 of 1
APPLICATION NO. : 10/943101
DATED              : July 18, 2006
INVENTOR(S)        : Luona Goh, et al.

It is certified that error appears in the above-identified patent and that said Letters Patent is hereby corrected as shown below:

Delete "(76) Inventors: Luona Goh, BIK 108, Bedok North Rd #09-2224, Singapore 460108 (SG); Simon Chooi, 60 Woodlands Industrial Park D Street 2, Singapore 738406 (SG); Siew Lok Toh, Dept of Mechanical Engrg, NUS, 10 Kent Ridge Cresent, Singapore 119260 (SG); Tong Earn Tay, Dept of Mech. Engrg, N. U.S., 10 Kent Ridge Cres., Singapore 119260 (SG) and replace with -- (75) Inventors: Luona Goh, Singapore, Singapore; Simon Chooi, Singapore, Singapore; Siew Lok Toh, Singapore, Singapore; Tong Earn Tay, Singapore, Singapore --.

Signed and Sealed this

Nineteenth Day of December, 2006

JON W. DUDAS
*Director of the United States Patent and Trademark Office*

UNITED STATES PATENT AND TRADEMARK OFFICE
CERTIFICATE OF CORRECTION

PATENT NO. : 7,078,333 B2  Page 1 of 1
APPLICATION NO. : 10/943101
DATED : July 18, 2006
INVENTOR(S) : Luona Goh et al.

It is certified that error appears in the above-identified patent and that said Letters Patent is hereby corrected as shown below:

Title Page,

Add (73) Assignee: Chartered Semiconductor Manufacturing LTD

Add (74) Attorney, Agent or Firm - George O. Saile; Rosemary L. S. Pike; Stephen B. Ackerman Signed and Sealed this Sixth Day of March, 2007

JON W. DUDAS
*Director of the United States Patent and Trademark Office*